United States Patent
Wu

(10) Patent No.: US 9,467,134 B2
(45) Date of Patent: Oct. 11, 2016

(54) PULSE WIDTH MODULATION CONTROL UNIT, VOLTAGE REGULATOR AND CONTROL METHOD THEREOF

(71) Applicant: Nuvoton Technology Corporation, Hsinchu (TW)

(72) Inventor: How-Wei Wu, Hsinchu (TW)

(73) Assignee: NUVOTON TECHNOLOGY CORPORATION, Hsinchu (TW)

( * ) Notice: Subject to any disclaimer, the term of this patent is extended or adjusted under 35 U.S.C. 154(b) by 91 days.

(21) Appl. No.: 14/484,835

(22) Filed: Sep. 12, 2014

(65) Prior Publication Data
US 2015/0349767 A1 Dec. 3, 2015

(30) Foreign Application Priority Data

May 28, 2014 (TW) .............................. 103118538 A

(51) Int. Cl.
| | |
|---|---|
| *H02M 3/158* | (2006.01) |
| *H03K 7/08* | (2006.01) |
| *H02M 3/156* | (2006.01) |
| *H02M 1/00* | (2006.01) |

(52) U.S. Cl.
CPC .............. *H03K 7/08* (2013.01); *H02M 3/156* (2013.01); *H02M 3/158* (2013.01); *H02M 2001/0045* (2013.01)

(58) Field of Classification Search
CPC ..................... H02M 3/158; H02M 2001/0045
See application file for complete search history.

(56) References Cited

U.S. PATENT DOCUMENTS

| 8,547,078 B2 | 10/2013 | Chiu et al. |
| 2007/0109821 A1 | 5/2007 | Yang |
| 2009/0010027 A1 | 1/2009 | Nishikawa |

(Continued)

FOREIGN PATENT DOCUMENTS

| TW | 200421699 A | 10/2004 |
| TW | 201041287 A | 11/2010 |

(Continued)

OTHER PUBLICATIONS

TW Office Action dated Sep. 3, 2015 from corresponding TW Appl No. 10421197210. 9 pp.

*Primary Examiner* — Jue Zhang
*Assistant Examiner* — Lakaisha Jackson
(74) *Attorney, Agent, or Firm* — Muncy, Geissler, Olds & Lowe, P.C.

(57) ABSTRACT

A PWM control unit is provided. A comparison unit compares an output voltage with a reference voltage to generate a first compared result, and controls a voltage of a first node. A constant current source is coupled to the first node. A storage module is coupled to the first node and receives a ground voltage. A first comparator compares the output voltage with the voltage of the first node to generate a turn-on signal. A second comparator compares the voltage of the first node with the input voltage to generate an output signal. A logic gate generates a turn-off signal according to the turn-on and output signals. When each of the turn-on and output signals is at a first level, a logic gate asserts the turn-off signal at a second level. The PWM generator combines the turn-on and turn-off signals to generate a PWM signal.

17 Claims, 4 Drawing Sheets

(56) References Cited

U.S. PATENT DOCUMENTS

| | | | | |
|---|---|---|---|---|
| 2009/0153114 A1* | 6/2009 | Huang | | H02M 3/1584 323/282 |
| 2012/0212204 A1* | 8/2012 | Philbrick | | H02M 3/156 323/284 |
| 2013/0027012 A1* | 1/2013 | Huang | | H02M 3/156 323/283 |
| 2014/0084886 A1* | 3/2014 | Causse | | H02M 3/158 323/282 |
| 2014/0300326 A1* | 10/2014 | Yang | | H02J 7/0052 320/162 |
| 2015/0177756 A1* | 6/2015 | Yuan | | G05F 1/56 323/271 |

FOREIGN PATENT DOCUMENTS

| | | |
|---|---|---|
| TW | 201212496 A | 3/2012 |
| TW | I360563 B1 | 12/2012 |

* cited by examiner

PULSE WIDTH MODULATION CONTROL UNIT, VOLTAGE REGULATOR AND CONTROL METHOD THEREOF

CROSS REFERENCE TO RELATED APPLICATIONS

This application claims priority of Taiwan Patent Application No. 103118538, filed on May 28, 2014, the entirety of which is incorporated by reference herein.

BACKGROUND OF THE INVENTION

1. Field of the Invention

The invention relates to a voltage regulator, and more particularly to a voltage regulator having a pulse width modulation (PWM) signal.

2. Description of the Related Art

Common operation systems utilize different voltages to drive different circuits. In general, a voltage regulator is usually utilized to convert an input voltage into a corresponding output voltage. The kinds of voltage regulators are boost regulators and buck regulators. In a boost regulator, the output voltage is higher than the input voltage. In a buck regulator, the output voltage is less than the input voltage. However, these two regulators consume more power when it stabilizes the output voltage.

BRIEF SUMMARY OF THE INVENTION

In accordance with an embodiment, a pulse width modulation (PWM) control unit includes a comparison unit, a constant current source, a storage module, a first comparator, a second comparator, a logic gate, and a PWM generator. The comparison unit compares an output voltage with a reference voltage to generate a first compared result, and controls a voltage of a first node according to the first compared result. The constant current source receives an input voltage and is coupled to the first node. The storage module is coupled to the first node and receives a ground voltage. The first comparator compares the output voltage with the voltage of the first node to generate a turn-on signal. The second comparator compares the voltage of the first node with the input voltage to generate an output signal. The logic gate generates a turn-off signal according to the turn-on signal and the output signal. When each of the turn-on signal and the output signal is at a first level, the logic gate asserts the turn-off signal at a second level, and the first level is lower than the second level. The PWM generator combines the turn-on signal and the turn-off signal to generate a PWM signal.

In accordance with another embodiment, a voltage regulator converts an input voltage into an output voltage and includes a first switch, a second switch, a filtering unit, a PWM control unit, and a driver. The first switch controls a voltage of a first node to be equal to the input voltage according to a first control signal. The second switch controls the voltage of the first node to be equal to a ground voltage according to a second control signal. The filtering unit generates the output voltage according to the voltage of the first node. The PWM control unit includes a comparison unit, a first comparator, a second comparator, a logic gate, and a PWM generator. The comparison unit compares the output voltage with a reference voltage to generate a first compared result and controls a voltage of a second node according to the first compared result. The first comparator compares the output voltage with the voltage of the second node to generate a turn-on signal. The second comparator compares the voltage of the second node with the input voltage to generate an output signal. The logic gate generates a turn-off signal according to the turn-on signal and the output signal. When each of the turn-on signal and the output signal is at a first level, the logic gate asserts the turn-off signal at a second level. The first level is lower than the second level. The PWM generator combines the turn-on signal and the turn-off signal to generate a PWM signal. The driver generates the first and the second control signals according to the PWM signal.

An exemplary embodiment of a control method is described in the following. An output stage circuit is utilized to convert an input voltage into an output voltage. The output voltage is compared with a reference voltage to generate a first compared result. A voltage of a first node is controlled according to the first compared result. A turn-on signal and a turn-off signal are generated according to the voltage of the first node. The turn-on signal and the turn-off signal are combined to generate a PWM signal. The PWM signal is decoded to generate a first control signal and a second control signal to the output stage circuit.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
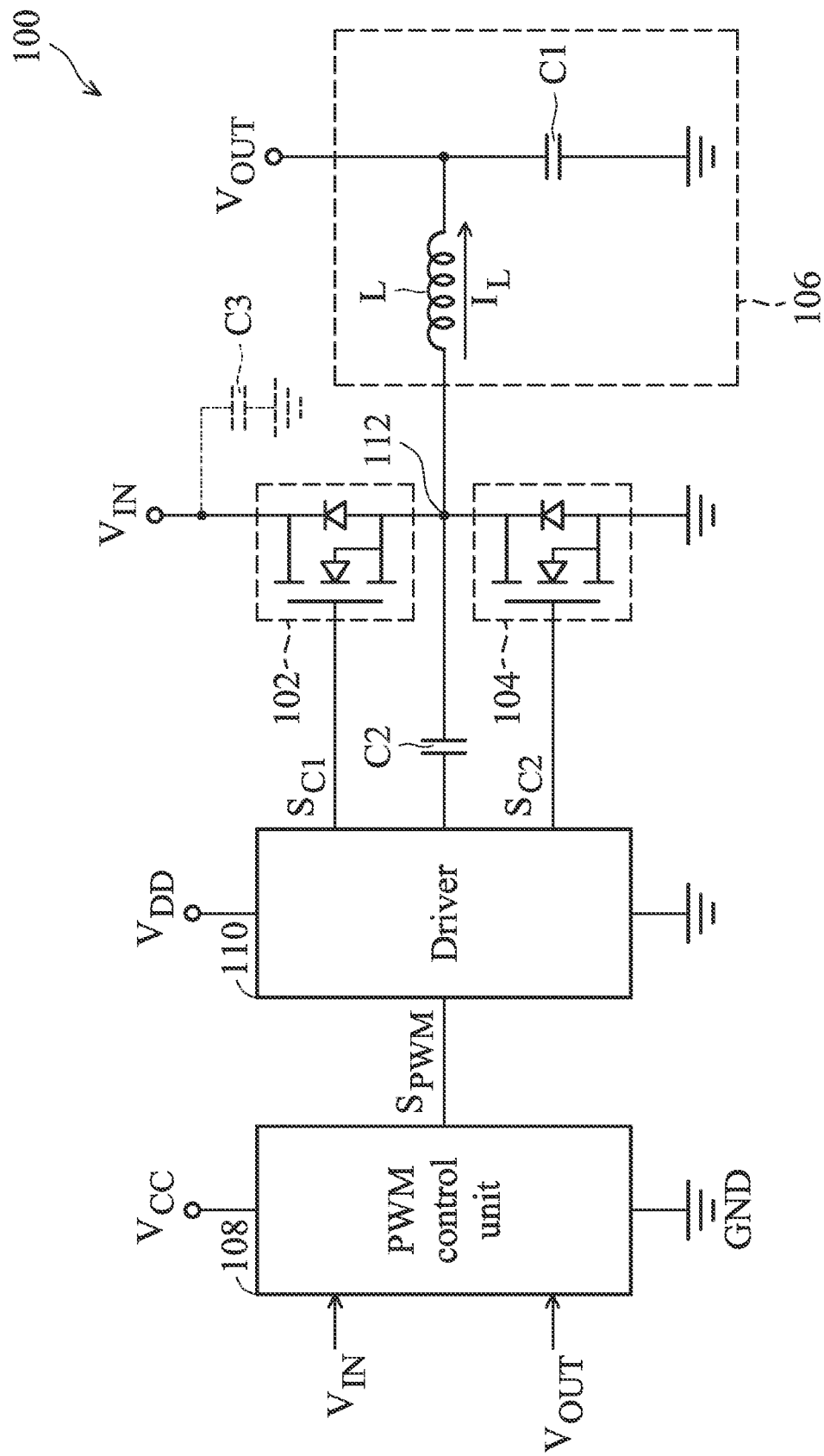
FIG. 1 is a schematic diagram of a voltage regulator according to an embodiment of the present invention.

FIG. 1 is a schematic diagram of a voltage regulator according to an embodiment of the present invention. The voltage regulator 100 converts an input voltage $V_{IN}$ into an output voltage $V_{OUT}$. In this embodiment, the voltage regulator 100 includes switches 102 and 104, a filtering unit 106, a pulse width modulation (PWM) control unit 108 and a driver 110. In some embodiments, a circuit uses the output voltage $V_{OUT}$ provided by the voltage regulator 100, and the circuit and the voltage regulator 100 are integrated into a chip.

The switch 102 controls the voltage of the node 112 to be equal to the input voltage $V_{IN}$ according to a control signal $S_{C1}$. For example, when the control signal $S_{C1}$ is at a high level, the switch 102 is turned on. Therefore, the voltage of the node 112 is equal to the input voltage $V_{IN}$. When the control signal $S_{C1}$ is at a low level, the switch 102 is turned off. At this time, the voltage of the node 112 is not equal to the input voltage $V_{IN}$.

The switch 104 controls the voltage of the node 112 to be equal to a ground voltage GND according to the control signal $S_{C2}$. For example, when the control signal $S_{C2}$ is at a high level, the switch 104 is turned on, the voltage of the node 112 is equal to the ground voltage GND. When the control signal $S_{C2}$ is at a low level, the switch 104 is turned off. Therefore, the voltage of the node 112 is not equal to the ground voltage GND.

In this embodiment, the switches 102 and 104 constitute an output stage circuit. Each of the switches 102 and 104 is an N-type transistor, but the disclosure is not limited thereto. In another embodiment, each of the switches 102 and 104 is a P-type transistor. In this case, when the control signal $S_{C1}$ or $S_{C2}$ is at the low level, the switch 102 or 104 is turned on. Since the control method of the P-type transistor is well known to those skilled in the field, the description of the control method is omitted. In some embodiments, one of the switches 102 and 104 is a P-type transistor and the another is an N-type transistor.

The filtering unit 106 generates an output voltage $V_{OUT}$ according to the voltage of the node 112. In this embodiment, the filtering unit 106 is a low-pass filter and includes an inductor L and a capacitor C1. When the switch 102 is turned on, the current $I_L$ passing through the inductor L is gradually increased and the output voltage $V_{OUT}$ is also gradually increased. When the switch 104 is turned on, the current $I_L$ passing through the inductor L is gradually reduced. Therefore, the output voltage $V_{OUT}$ is also gradually reduced. When the switches 102 and 104 are turned off, the current $I_L$ passing through the inductor L is equal to zero. At this time, the output voltage $V_{OUT}$ is gradually reduced.

The PWM control unit 108 generates a PWM signal $S_{PWM}$ according to the input voltage $V_{IN}$ and the output voltage $V_{OUT}$. The details of the PWM control unit 108 will be described in greater detail with reference to FIG. 2. The driver 110 generates the control signals $S_{C1}$ and $S_{C2}$ according to the PWM signal $S_{PWM}$. In this embodiment, the driver 110 decodes the PWM signal $S_{PWM}$ and generates the control signals $S_{C1}$ and $S_{C2}$ according to the decoded result.

In one embodiment, when the output voltage $V_{OUT}$ is lower than a reference voltage, the driver 110 turns on the switch 102 to increase the current $I_L$ and the output voltage $V_{OUT}$. Then, the driver 110 turns on the switch 104 to avoid that the output voltage $V_{OUT}$ being too high. At this time, the current $I_L$ is gradually reduced. Finally, the driver 110 turns off the switches 102 and 104. Therefore, no current passes through the inductor L.

In this embodiment, the PWM control unit 108 and the driver 110 have different operation voltages, such as $V_{CC}$ and $V_{DD}$. Furthermore, since the switch 102 is an N-type transistor, a capacitor C2 is coupled between the driver 110 and the node 112. The capacitor C2 is utilized in such a way that the difference between the voltage of the control signal $S_{C1}$ generated by the driver 110 and the voltage of the node 112 is higher than the threshold voltage of the switch 102. Therefore, the switch 102 is turned on.

In some embodiments, if the switch 102 is a P-type transistor, the capacitor C2 can be omitted. Furthermore, a capacitor C3 is coupled between the input voltage $V_{IN}$ and the ground voltage GND to stable the level of the input voltage $V_{IN}$. In other embodiments, the capacitor C3 is omitted.

Figure 2:
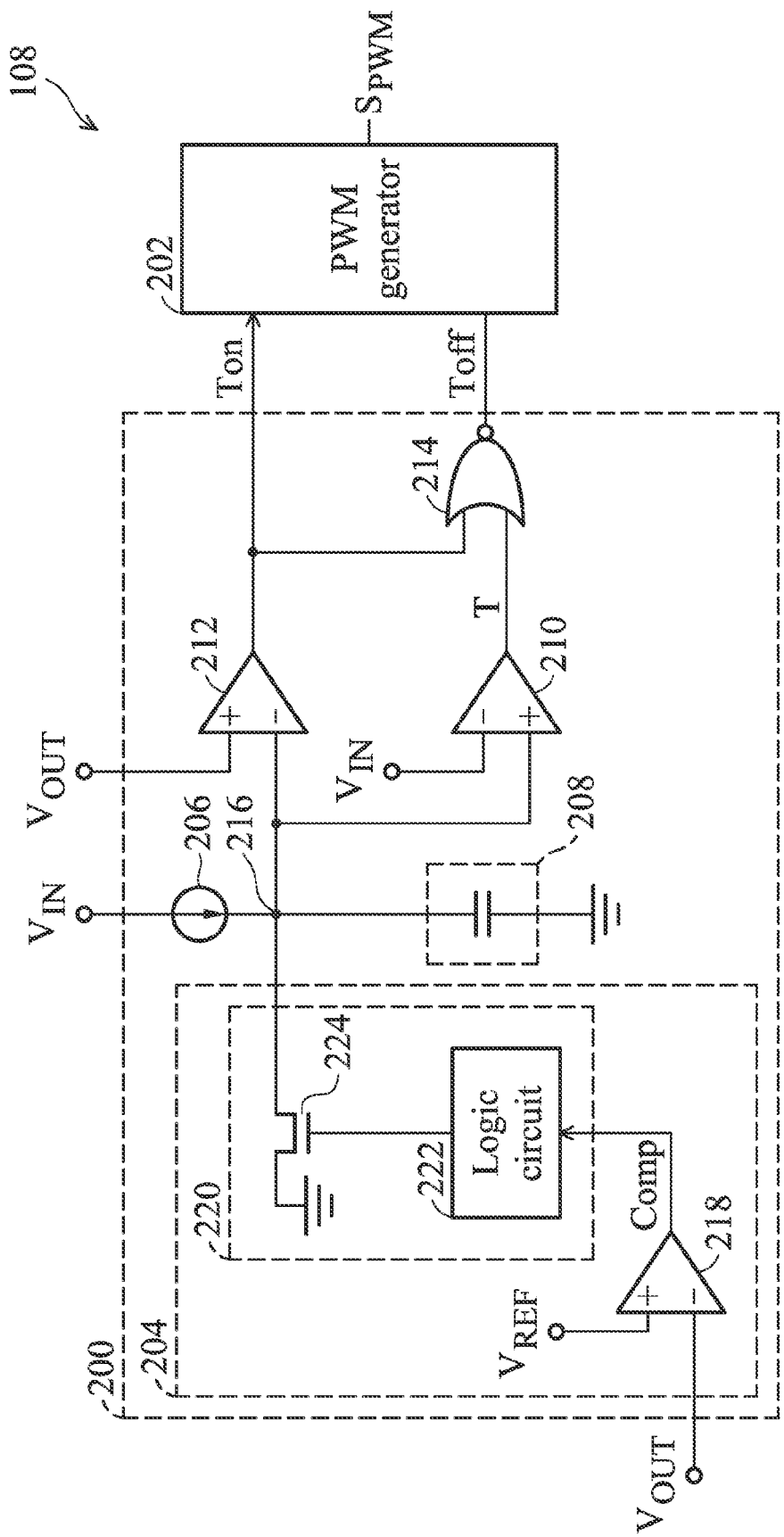
FIG. 2 is a schematic diagram of a PWM control unit according to an embodiment of the present invention.

FIG. 2 is a schematic diagram of an exemplary embodiment of a PWM control unit. The PWM control unit 108 includes an on/off timing generator 200 and a PWM generator 202. The on/off timing generator 200 includes a comparison unit 204, a constant current source 206, a storage module 208, comparators 210 and 212 and a logic gate 214.

The comparison unit 204 compares the output voltage $V_{OUT}$ with a reference voltage $V_{REF}$ and controls the voltage of the node 216 according to the compared result. In one embodiment, when the output voltage $V_{OUT}$ is lower than the reference voltage $V_{REF}$, the comparator 204 first sets the voltage of the node 216 to be equal to the ground voltage GND to release the electric charges stored in the storage module 208. For example, the level of the node 216 is pulled down to equal a level of a ground node. Next, the comparison unit 204 sets the node 216 into a charge state. At this time, since the storage module 208 is coupled to the constant current source 206, the constant current source 206 charges the storage module 208. Therefore, the voltage of the node 216 is gradually increased.

In this embodiment, the comparison unit 204 includes a comparator 218 and a reset module 220. The comparator 218 compares the output voltage $V_{OUT}$ with the reference voltage $V_{REF}$ to generate a compared result Comp. In one embodiment, when the output voltage $V_{OUT}$ is higher than the reference voltage $V_{REF}$, the compared result is at a low level. When the output voltage $V_{OUT}$ is lower than the reference voltage $V_{REF}$, the compared result is at a high level.

The reset module 220 is coupled between the comparator 218 and the node 216 to control the voltage of the node 216 according to the compared result Comp. When the compared result Comp is at the low level, the reset module 220 sets the node 216 so that it is not coupled to the ground node. At this time, the voltage of the node 216 may be gradually increased.

When the compared result Comp is at the high level, the reset module 220 resets the voltage of the node 216. In one embodiment, the reset module 220 first sets the voltage of the node 216 to be equal to the ground voltage to release the electric charges stored in the storage module 208. For example, the reset module 220 pulls down the voltage of the node 216 to be equal to a level of a ground node. Then, the reset module 220 sets the state of the node 216 in a charge state. At this time, since the constant current source 206 is coupled to the storage module 208, the constant current source 206 starts charging the storage module 208.

In this embodiment, the reset module 220 includes a logic circuit 222 and a switch 224. The logic circuit 222 controls the switch 224 according to the compared result Comp. For example, when the compared result Comp is at a first level, the logic circuit 222 turns off the switch 224. When the compared result is at a second level, the logic circuit 222 first turns on the switch 224. After a time period, the logic circuit 222 turns off the switch 224. In this embodiment, the switch 224 is an N-type transistor. In one embodiment, the logic circuit pulls down the voltage of the node 216 to be equal to the voltage of a ground node for a time period and then directs the node 216 to a charge state when the output voltage is lower than the reference voltage $V_{REF}$. During time period, the electric charges stored in the storage module 208 is discharged to the ground node.

Additionally, the constant current source 206 receives the input voltage $V_{IN}$ and is coupled to the node 216. The storage module 208 is coupled to the node 216 and receives the ground voltage GND. The invention does not limit the structures of the constant current source 206 and the storage module 208. In one embodiment, the constant current source 206 is constituted by a transistor and the storage module 208 may be a capacitor.

The comparator 212 compares the output voltage $V_{OUT}$ and the voltage of the node 216 to generate a turn-on signal Ton. The comparator 210 compares the voltage of the node 216 and the input voltage $V_{IN}$ to generate an output signal T. The logic gate 214 generates a turn-off signal Toff according to the turn-on signal Ton and the output signal T. In this embodiment, when each of the turn-on signal Ton and the output signal T is at a first level, the logic gate 214 sets the turn-off signal Toff to be equal to a second level. When one of the turn-on signal Ton and the output signal T is at a second level, the logic gate 214 sets the turn-off signal Toff to be equal to a first level. In one embodiment, the first level is a low level and the second level is a high level. In this embodiment, the logic gate 214 is an NOR gate.

Figure 3:
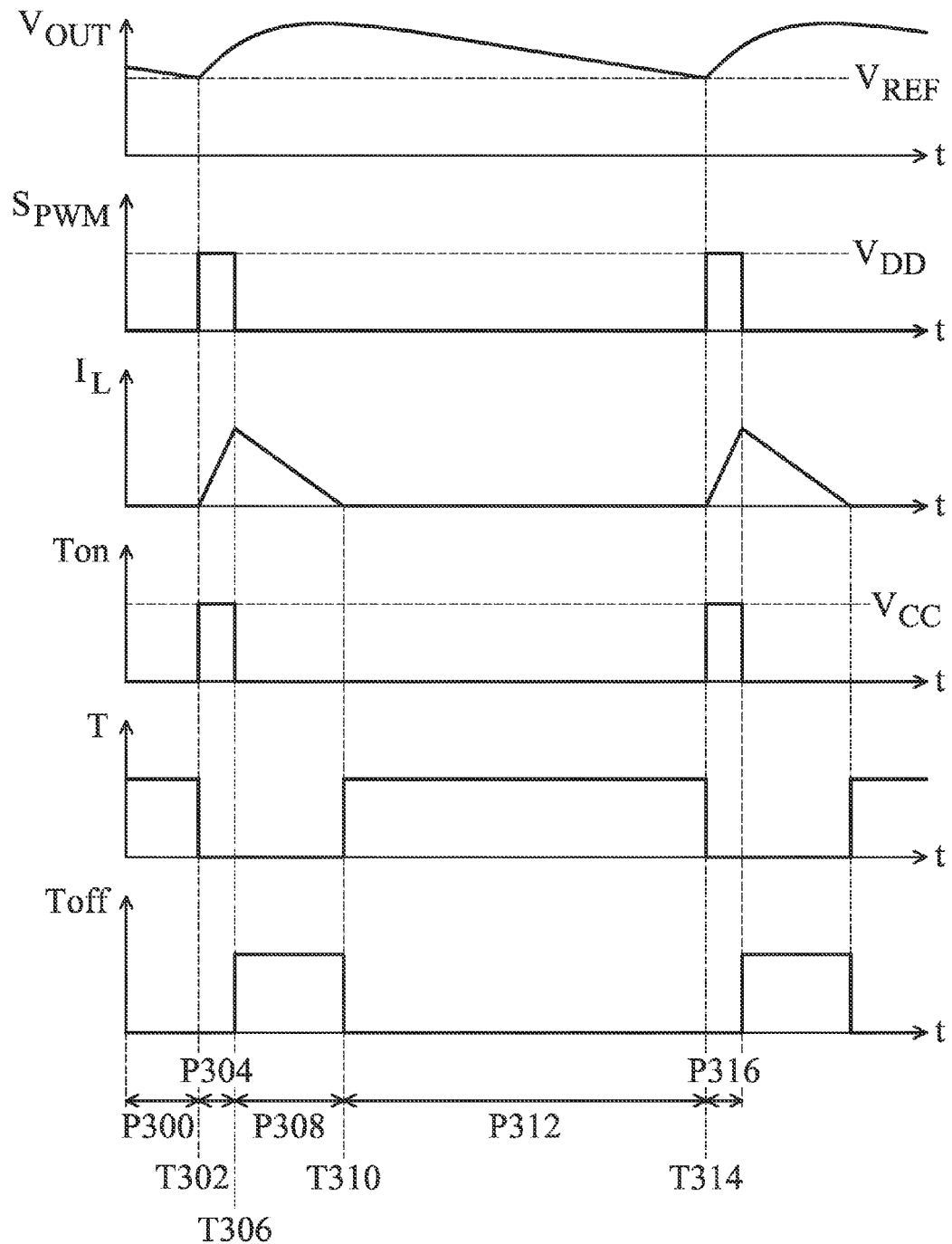
FIG. 3 is a wave schematic diagram of the voltage regulator.

The PWM generator 202 combines the turn-on signal Ton and the turn-off signal Toff to generate the PWM signal $S_{PWM}$. FIG. 3 is a wave schematic diagram of the voltage regulator according to one embodiment of the present invention. During time period P300, the output voltage $V_{OUT}$ is higher than the reference voltage $V_{REF}$. Therefore, the driver 110 turns off the switches 102 and 104. As shown in FIG. 3, the current $I_L$ passing through the inductor L is equal to zero.

At time point T302, the output voltage $V_{OUT}$ is lower than the reference voltage $V_{REF}$. Therefore, the comparator 218 directs the compared result Comp to activate the reset module 220 such that the reset module 220 resets the voltage of the node 216. In other words, the logic circuit 222 of the reset module 220 first turns on the switch 224. After a time period, the logic circuit 222 turns off the switch 224. Then, the constant current source 206 charges the storage module 208 such that the voltage of the node 216 is gradually increased. When the voltage of the node 216 is not higher than the output voltage $V_{OUT}$, the level of the turn-on signal Ton is changed from a first level (e.g. a low level) to a second level (e.g. a high level).

During time period P304, the voltage of the node 216 is gradually increased but is not greater than the output voltage $V_{OUT}$. Therefore, the level of the turn-on signal Ton is maintained at a high level. At this time, since the voltage of the node 216 is not greater than the input voltage $V_{IN}$, the output signal T is at a low level. At this time, since the turn-on signal Ton is at the high level, the turn-off signal Toff is at the low level. The PWM generator 202 combines the turn-on signal Ton and the turn-off signal Toff to generate the PWM signal $S_{PWM}$. As shown in FIG. 3, during time period P304, the PWM signal $S_{PWM}$ is at the high level. Therefore, the current $I_L$ passing through the inductor L is gradually increased. At this time period, the switch 102 is turned on and the switch 104 is turned off.

At time point T306, the voltage of the node 216 is greater than the output voltage $V_{OUT}$. Therefore, the turn-on signal Ton is changed from a second level to a first level.

During time period P308, since the voltage of the node 216 is still greater than the output voltage $V_{OUT}$, the turn-on signal Ton is maintained at the first level. During this time period, since the voltage of the node 216 is not higher than the input voltage $V_{IN}$, the output signal T is maintained in the first level. Each of the turn-on signal Ton and the output signal T is at the first level such that the turn-off signal Toff is at the high level. During this time period, the PWM signal $S_{PWM}$ is at the low level. The driver 110 turns off the switch 102 and turns on the switch 104 according to the PWM signal $S_{PWM}$ such that the current $I_L$ passing through the inductor L is gradually reduced.

At time point T310, since the voltage of the node 216 is still greater than the output voltage $V_{OUT}$, the turn-on signal Ton is maintained at the first level. At this time, the voltage of the node 216 is greater than the input voltage $V_{IN}$ such that the output signal T is changed from the first level to the second level.

During time period P312, since the voltage of the node 216 is still greater than the input voltage $V_{IN}$, the output signal T is maintained at the second level. During this time period, the turn-on signal Ton is still at the first level. Therefore, the turn-off signal Toff is at the first level. The PWM generator 202 combines the turn-on signal Ton and the turn-off signal Toff to generate the PWM signal $S_{PWM}$. The driver 110 turns off the switches 102 and 104 according to the PWM signal $S_{PWM}$. Therefore, no current passes through the inductor L.

At time point T314, the output voltage $V_{OUT}$ is lower than the reference voltage $V_{REF}$ such that the comparator 218 generates the compared result Comp to control the reset module 220 to reset the voltage of the node 216. Since time points T314 and T302 have the same principle and time periods P316 and P304 have the same principle, descriptions of time point T314 and time period P316 are omitted for brevity. In this embodiment, time period P312 is longer than time period P308, and time period P308 is longer than time period P304, but the disclosure is not limited thereto.

When the output voltage $V_{OUT}$ is lower than the reference voltage $V_{REF}$, the driver 110 generates the controls signal $S_{C1}$ to turn on the switch 102 and increase the output voltage $V_{OUT}$. In one embodiment, the phase of the control signal $S_{C1}$ is equal to the phase of the turn-on signal Ton. In another embodiment, the level of the control signal $S_{C1}$ may be not equal to the level of the turn-on signal Ton.

When the switch 102 is turned on and the capacitor C1 has enough of an electric charge, the driver 110 generates the control signal $S_{C2}$ to turn on the switch 104 to avoid the output voltage $V_{OUT}$ so that it is too high. The capacitor C1 is charged by the current $I_L$ passing through the inductor L. In one embodiment, the phase of the control signal $S_{C2}$ is equal to the phase of the turn-off signal Toff. In another embodiment, the level of the control signal $S_{C2}$ may be not equal to the level of the turn-off signal Toff.

Finally the driver 110 turns off the switches 102 and 104 to enter a discontinuous mode (DCM). In the DCM, no current passes through the inductor L. The invention defines this mode as a natural zero current (NZC) operation.

Figure 4:
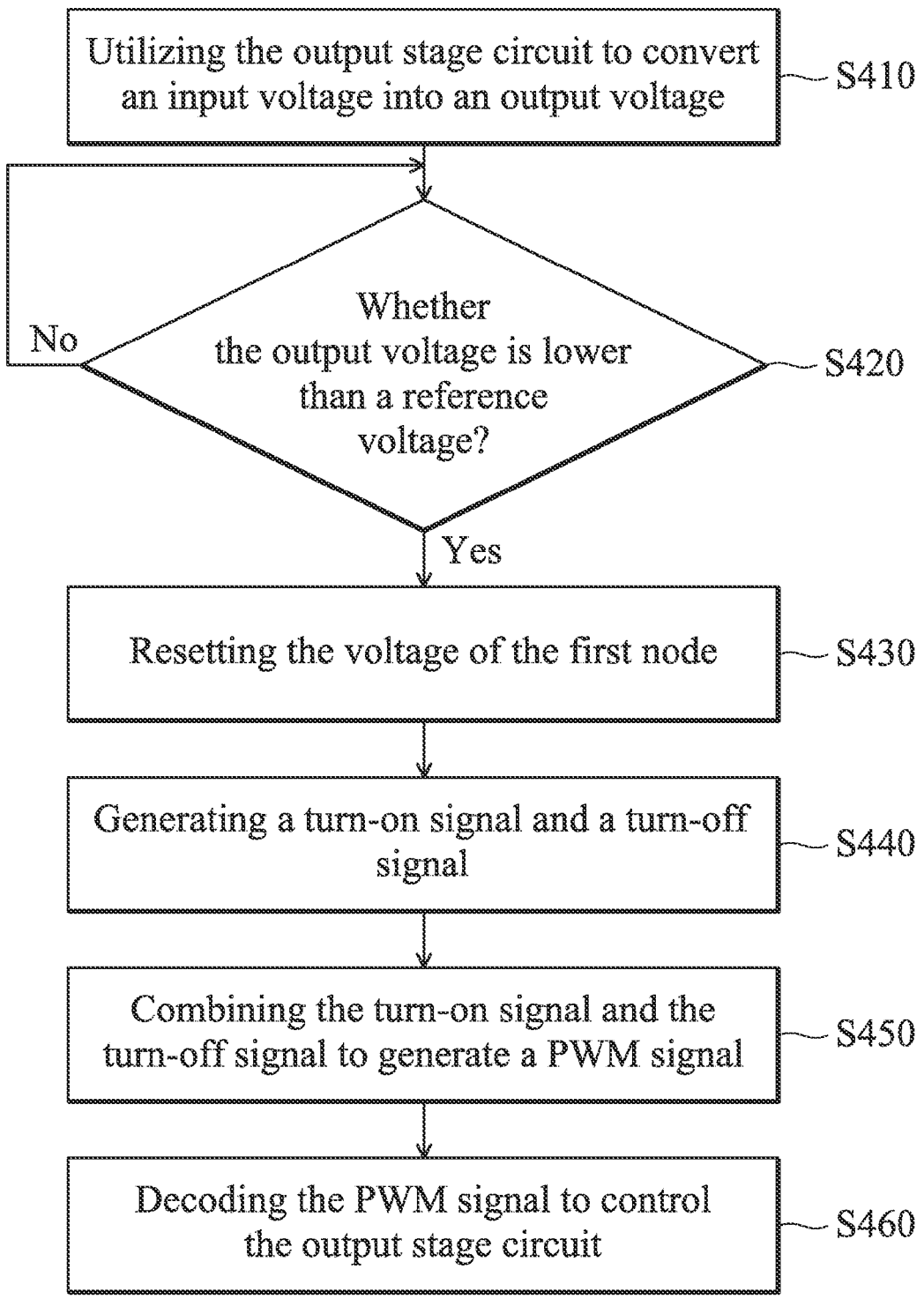
FIG. 4 is a flowchart of a control method according to an embodiment of the present invention.

FIG. 4 is a flowchart of an exemplary embodiment of a control method of the present invention. First, an output stage circuit is utilized to convert an input voltage into an output voltage (step S410). In one embodiment, the output stage circuit includes two switches. The switches are connected in series with one another and arranged between the input voltage and a ground voltage. The turn-on and the turn-off times of the switches are adjusted to generate a corresponding output voltage.

Then, it is determined whether the output voltage is lower than a reference voltage (step S420). When the output voltage is lower than the reference voltage, step S420 is executed. When the output voltage is lower than the reference voltage, a voltage of a first node is reset (step S430). In one embodiment, in step S430, the voltage of the first node is first controlled to be equal to the ground voltage and then set the first node to a charge state. In another embodiment, when the first node is in the charge state, power is provided to the first node to increase the voltage of the first node. In another embodiment, the first node is coupled to a storage module to store an electric charge.

A turn-on signal and a turn-off signal are generated according to the voltage of the first node (step S440). In one embodiment, the voltage of the first node is compared with the output voltage to generate the turn-on signal in step S440. For example, when the voltage of the first node is higher than the output voltage, the turn-on signal is at a low level. When the voltage of the first node is not higher than the output voltage, the turn-on signal is at a high level.

In step S440, the voltage of the first node is also compared with the input voltage to generate an output signal. In one embodiment, when the voltage of the first node is higher than the input voltage, the output signal is at a high level. When the voltage of the first node is less than the input voltage, the output signal is at a low level.

In step S440, a turn-off signal is generated according to the levels of the turn-on signal and the output signal. For example, when at least one of the turn-on signal and the output signal is at a high level, the turn-off signal is at a low level. When each of the turn-on signal and the output signal is at a low level, the turn-off signal is at a high level.

Then the turn-on signal and the turn-off signal are combined to generate a PWM signal (step S450). In this embodiment, when the output voltage is lower than the reference voltage, the PWM signal has a positive pulse to increase the output voltage.

Finally, the PWM signal is decoded to control the output stage circuit (step S460). After decoding the PWM signal, two control signals are obtained. In one embodiment, the phase of a first control signal is equal to the phase of the turn-on signal, and the phase of a second control signal is equal to the phase of the turn-off signal. In another embodiment, the level of the first control signal is not equal to the level of the turn-on signal, and the level of the second control signal is not equal to the level of the turn-off signal.

Two control signals are utilized to control the two switches of the output stage circuit to stabilize the output voltage. In one embodiment, a first control signal is changed from a first level (e.g. a low level) to a second level (e.g. a high level) during a first time period. The first control signal is maintained in the second level for a first specified time period. After the first time period, the first control signal is changed from the second level to the first level. Therefore, the output stage circuit can increase the output voltage during the first time period.

During a second time period, a second control is changed from the first level to the second level. The second control signal is maintained at the second level for a second specified time period. After the second time period, the second control signal is changed from the second level to the first level. Therefore, the output stage circuit stops increasing the output voltage during the second time period. In one embodiment, the output stage circuit gradually reduces the output voltage to avoid the output voltage being too high.

During a third time period, the first and second control signals are maintained at the first level. The output stage circuit stops adjusting the output voltage. At this time period, since the output stage circuit stops operating, power consumption of the output stage circuit can be reduced.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A pulse width modulation (PWM) control unit, comprising:
    a comparison unit comparing an output voltage with a reference voltage to generate a first compared result and controlling a voltage of a first node according to the first compared result;
    a constant current source receiving an input voltage and coupled to the first node;
    a storage module coupled to the first node and receiving a ground voltage;
    a first comparator comparing the output voltage with the voltage of the first node to generate a turn-on signal;
    a second comparator comparing the voltage of the first node with the input voltage to generate an output signal;
    a logic gate generating a turn-off signal according to the turn-on signal and the output signal, wherein when each of the turn-on signal and the output signal is at a first level, the logic gate asserts the turn-off signal at a second level, and the first level is lower than the second level; and
    a PWM generator combining the turn-on signal and the turn-off signal to generate a PWM signal.

2. The PWM control unit as claimed in claim 1, wherein the comparison unit comprises:
    a third comparator comparing the output voltage and the reference voltage to generate a second compared result; and
    a reset module coupled between the third comparator and the first node and resetting the voltage of the first node according to the second compared result.

3. The PWM control unit as claimed in claim 2, wherein when the output voltage is lower than the reference voltage, the reset module asserts the voltage of the first node to be equal to the ground voltage during a first time period and asserts the voltage of the first node to a non-ground voltage during a second time period.

4. The PWM control unit as claimed in claim 3, wherein during the first time period, the storage module is in a discharge state, and during the second time period, the constant current source charges the storage module.

5. The PWM control unit as claimed in claim 1, wherein the logic gate is a NOR gate.

6. A voltage regulator converting an input voltage into an output voltage and comprising:
    a first switch controlling a voltage of a first node to be equal to the input voltage according to a first control signal;
    a second switch controlling the voltage of the first node to be equal to a ground voltage according to a second control signal;
    a filtering unit generating the output voltage according to the voltage of the first node;
    a PWM control unit comprising:
    a comparison unit comparing the output voltage with a reference voltage to generate a first compared result and controlling a voltage of a second node according to the first compared result;
    a first comparator comparing the output voltage with the voltage of the second node to generate a turn-on signal;

a second comparator comparing the voltage of the second node with the input voltage to generate an output signal;

a logic gate generating a turn-off signal according to the turn-on signal and the output signal, wherein when each of the turn-on signal and the output signal is at a first level, the logic gate asserts the turn-off signal at a second level, and the first level is lower than the second level; and a PWM generator combining the turn-on signal and the turn-off signal to generate a PWM signal; and a driver generating the first and the second control signals according to the PWM signal.

7. The voltage regulator as claimed in claim 6, further comprising:

a constant current source receiving the input voltage and coupled to the second node; and a storage module coupled to the second node and receiving the ground voltage.

8. The voltage regulator as claimed in claim 6, wherein the comparison unit comprises:

a third comparator comparing the output voltage and the reference voltage to generate a second compared result; and a reset module coupled between the third comparator and the second node and resetting the voltage of the second node according to the second compared result.

9. The voltage regulator as claimed in claim 8, wherein when the output voltage is lower than the reference voltage, the reset module asserts the voltage of the second node to be equal to the ground voltage during a first time period and asserts the voltage of the second node to a non-ground voltage during a second time period.

10. The voltage regulator as claimed in claim 9, wherein during the first time period, the storage module is at a discharge state, and during the second time period, the constant current source charges the storage module.

11. The voltage regulator as claimed in claim 6, wherein during a first time period, the first switch is turned on to assert the voltage of the first node to be equal to the input voltage, during a second time period, the second switch is turned on to assert the voltage of the first node to be equal to the ground voltage, and during a third time period, the first and the second switches are turned off.

12. The voltage regulator as claimed in claim 11, wherein the filtering unit is a low-pass filter comprising a inductor and a capacitor, during the first time period, current passing through the inductor is increased, during the second time period, the current passing through the inductor is reduced, and during the third time period, no current passes through the inductor.

13. A control method comprising:

utilizing an output stage circuit to convert an input voltage into an output voltage;

comparing the output voltage with a reference voltage to generate a first compared result and controlling a voltage of a first node according to the first compared result;

generating a turn-on signal and a turn-off signal according to the voltage of the first node;

combining the turn-on signal and the turn-off signal to generate a PWM signal; and decoding the PWM signal to generate a first control signal and a second control signal to the output stage circuit, wherein a phase of the first control signal is equal to a phase of the turn-on signal, and a phase of the second control signal is equal to a phase of the turn-off signal.

14. The control method as claimed in claim 13, wherein when the output voltage is lower than the reference voltage, the voltage of the first node is reset.

15. The control method as claimed in claim 13, wherein when the output voltage is lower than the reference voltage, the voltage of the first node is asserted to a ground voltage during a first time period and the voltage of the first node is asserted to a non-ground voltage during a second time period.

16. The control method as claimed in claim 13, wherein a level of the first control signal is not equal to a level of the turn-on signal, and a level of the second control signal is not equal to a level of the turn-off signal.

17. The control method as claimed in claim 13, wherein during a first time period, the first control signal is changed from a first level to a second level and the first control signal is maintained at the second level for a first time, after the first time period, the first control signal is changed from the second level to the first level, during a second time period, the second signal is changed from the first level to the second level and the second control signal is maintained at the second level for a second time, after the second time period, the second control signal is changed from the second level to the first level, and during a third time period, each of the first and the second control signals is maintained at the first level.

* * * * *